US010123448B1

(12) United States Patent
Liu

(10) Patent No.: US 10,123,448 B1
(45) Date of Patent: Nov. 6, 2018

(54) SERVER UNIT AND SERVER

(71) Applicant: Wistron Corporation, New Taipei (TW)

(72) Inventor: Chia-Hsin Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/964,077

(22) Filed: Apr. 27, 2018

(30) Foreign Application Priority Data

Feb. 9, 2018 (TW) .............................. 107104645 A

(51) Int. Cl.
*H05K 7/20* (2006.01)
*H05K 7/14* (2006.01)

(52) U.S. Cl.
CPC ......... *H05K 7/1489* (2013.01); *H05K 7/1487* (2013.01)

(58) Field of Classification Search
CPC .............................. H05K 7/18; H05K 7/20136
See application file for complete search history.

(56) References Cited

U.S. PATENT DOCUMENTS

| 7,344,439 B2 * | 3/2008 | Henry | H05K 7/1445 |
| | | | 361/679.48 |
| 8,456,843 B2 * | 6/2013 | Wang | H05K 7/1487 |
| | | | 312/223.1 |
| 9,125,323 B2 | 9/2015 | Lee et al. | |
| 2011/0124278 A1 | 5/2011 | Lee et al. | |
| 2013/0249359 A1 | 9/2013 | Tang | |

FOREIGN PATENT DOCUMENTS

| TW | M332244 | 5/2008 |
| TW | M399578 | 3/2011 |
| TW | 201340822 | 10/2013 |
| TW | I468911 | 1/2015 |
| TW | I547231 | 8/2016 |
| TW | M532715 | 11/2016 |

\* cited by examiner

*Primary Examiner* — Anthony Q Edwards
(74) *Attorney, Agent, or Firm* — JCIPRNET

(57) ABSTRACT

A server unit suitable for being installed in a chassis is provided. The chassis has at least two accommodate spaces. The server unit includes a main body and at least one blocking board. The main body is suitable for being received in one of the accommodate spaces. The blocking board is pivoted to the main body and pivotally rotates between a closed state and an opened state. When the blocking board is in the closed state, the blocking board is adjacent to an outer surface of the main body. When the blocking board is in the opened state, the blocking board is opened from the outer surface and blocks the other accommodate space. A server including the server unit is also provided.

20 Claims, 7 Drawing Sheets

SERVER UNIT AND SERVER

CROSS-REFERENCE TO RELATED APPLICATION

This application claims the priority benefit of Taiwan application serial no. 107104645, filed on Feb. 9, 2018. The entirety of the above-mentioned patent application is hereby incorporated by reference herein and made a part of this specification.

BACKGROUND

Field of the Disclosure

The disclosure is related to a server unit and a server, and particularly to a server unit having a blocking board and a server having the server unit.

Description of Related Art

Along with advancement of technologies, the information era has arrived. In order to process large amount of data, the use of server is increasing. To allow server to operate normally, it is required that the chassis accommodating the server can dissipate heat effectively.

Generally speaking, the chassis for server is divided into a plurality of accommodating spaces for accommodating a plurality of server units respectively, and each of the accommodating spaces may be provided with blocking board therein. When one of the servers is taken out of the chassis, the blocking board can prevent the heat in the accommodating space from flowing out of the accommodating space and returning back the chassis, thereby avoiding that the server is over-heated. However, it takes excessive configuration space to dispose blocking board in the chassis.

SUMMARY

The disclosure provides a server unit and a server, which can save the configuration space in chassis and prevent the heat from flowing back to the chassis.

A server unit of the disclosure is adapted to be disposed in a chassis. The chassis has two accommodating spaces. The server unit includes a main body and a blocking board. The server unit is received in one of the accommodating spaces. The blocking board is pivoted to the main body and rotated pivotally between a closed state and an opened state. When the blocking board is in the closed state, the blocking board is adjacent to an outer surface of the main body. When the blocking board is in the opened state, the blocking board is opened from the outer surface and blocks the other accommodating space.

A server unit in the disclosure is adapted to be disposed in a chassis, including a main body received in the chassis, and a blocking board pivoted to the main body and rotated pivotally between a closed state and an opened state. When the blocking board is in the closed state, the blocking board is adhered to an outer surface of the main body. When the blocking board is in the opened state, the projections of the main body and the blocking board on a plane behind the chassis are not overlapped to each other, and the outer surface and the plane are perpendicular to each other.

A server of the disclosure includes a chassis and a server unit. The chassis has two accommodating spaces. A server unit is adapted to be disposed in the chassis and the server unit includes a main body and a blocking board. The main body is received in one of the accommodating spaces. The blocking board is pivoted to the main body and rotated pivotally between a closed state and an opened state. When the blocking board is in the closed state, the blocking board is adjacent to an outer surface of the main body. When the blocking board is in the opened state, the blocking board is opened from the outer surface and blocks the other accommodating space.

In an embodiment of the disclosure, the server unit further includes a locking structure. The locking structure is disposed on the main body. When the blocking board is in the closed state, the blocking board is adapted to be locked on the locking structure.

In an embodiment of the disclosure, the blocking board has a boss. The blocking board is locked on the locking structure through the boss.

In an embodiment of the disclosure, the chassis has a bump. The bump is adapted to prop the blocking board toward the locking structure such that the blocking board is locked on or released from the locking structure.

In an embodiment of the disclosure, the chassis has a pin. The pin is adapted to be inserted between the blocking board and the locking structure such that the locking structure releases the blocking board.

In an embodiment of the disclosure, the chassis has a spacer. The spacer spaces two accommodating spaces apart. The bump is disposed on the spacer. The main body is adapted to be moved along the spacer and pass through the bump.

In an embodiment of the disclosure, the main body has a space-allowing recess. When the server unit is received in the accommodating space, the bump is in the space-allowing recess.

In an embodiment of the disclosure, the server unit further includes an elastic element. The elastic element is connected between the main body and the blocking board. The blocking board is adapted to rotate pivotally from a closed state to an opened state through elastic force of the elastic element.

An embodiment of the disclosure includes another blocking board. The two blocking boards are respectively pivoted to two opposite sides of the main body and rotated pivotally between the closed state and the opened state respectively.

In an embodiment of the disclosure, the main body has a front end and a rear end opposite to each other. The main body enters the accommodating space through the rear end, and the blocking board is disposed at the rear end.

An embodiment of the disclosure includes another server unit. When the two server units are respectively received in the two accommodating spaces, one server unit stops the blocking board of the other server unit from being rotated pivotally to the opened state.

As indicated above, in the server of the disclosure, the server unit has the blocking board that may be rotated pivotally between the closed state and the opened state. When a server unit is taken from one accommodating space of the chassis, the blocking board of another adjacent server unit may be opened to block the accommodating space to prevent heat from flowing out of the accommodating space and returning back to the chassis. As described above, the blocking board is disposed on the server unit instead of the chassis such that the configuration space in the chassis can be saved.

In order to make the aforementioned features and advantages of the disclosure more comprehensible, embodiments accompanying figures are described in detail below.

DESCRIPTION OF EMBODIMENTS

Figure 1:
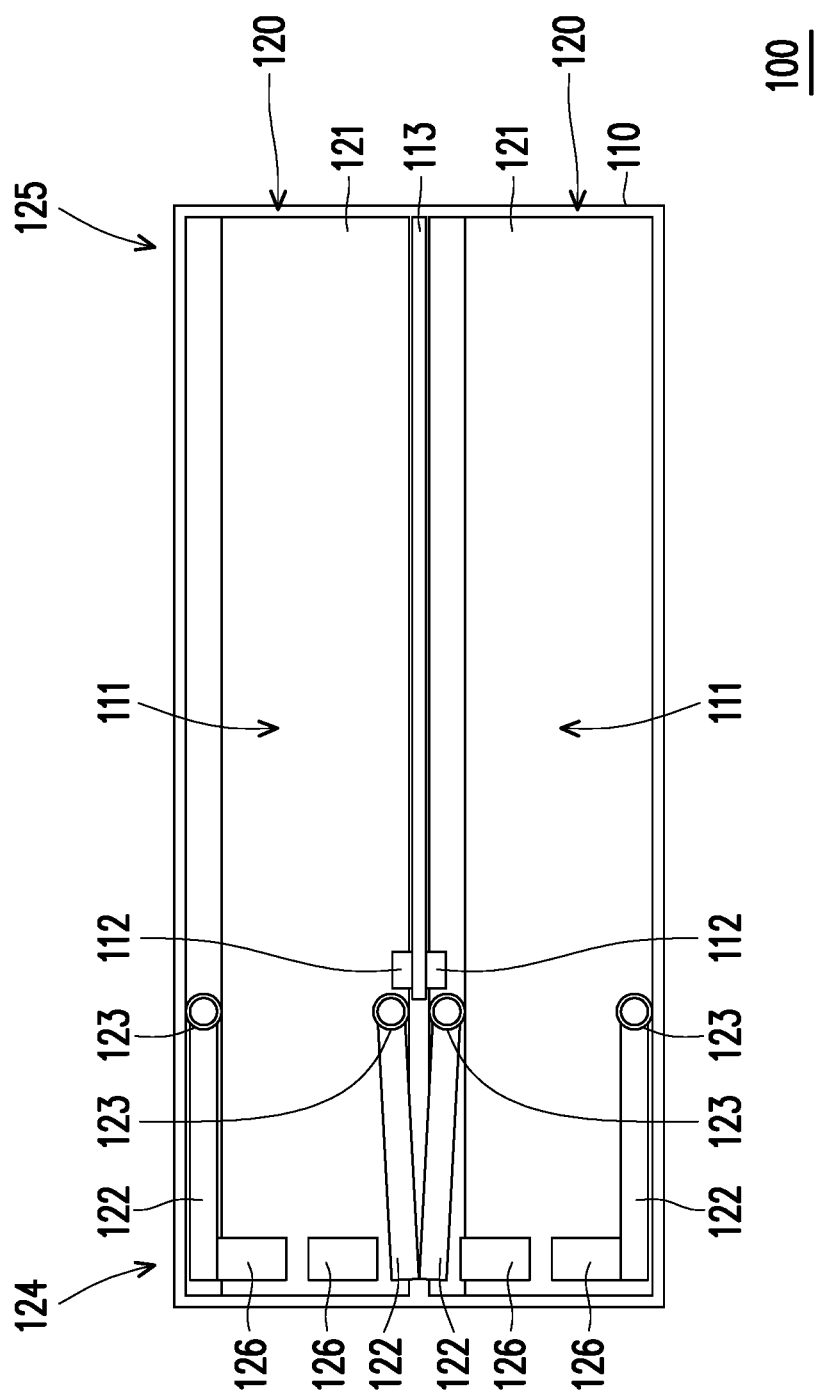
FIG. 1 is a schematic side view illustrating a server according to an embodiment of the disclosure.
Figure 2:
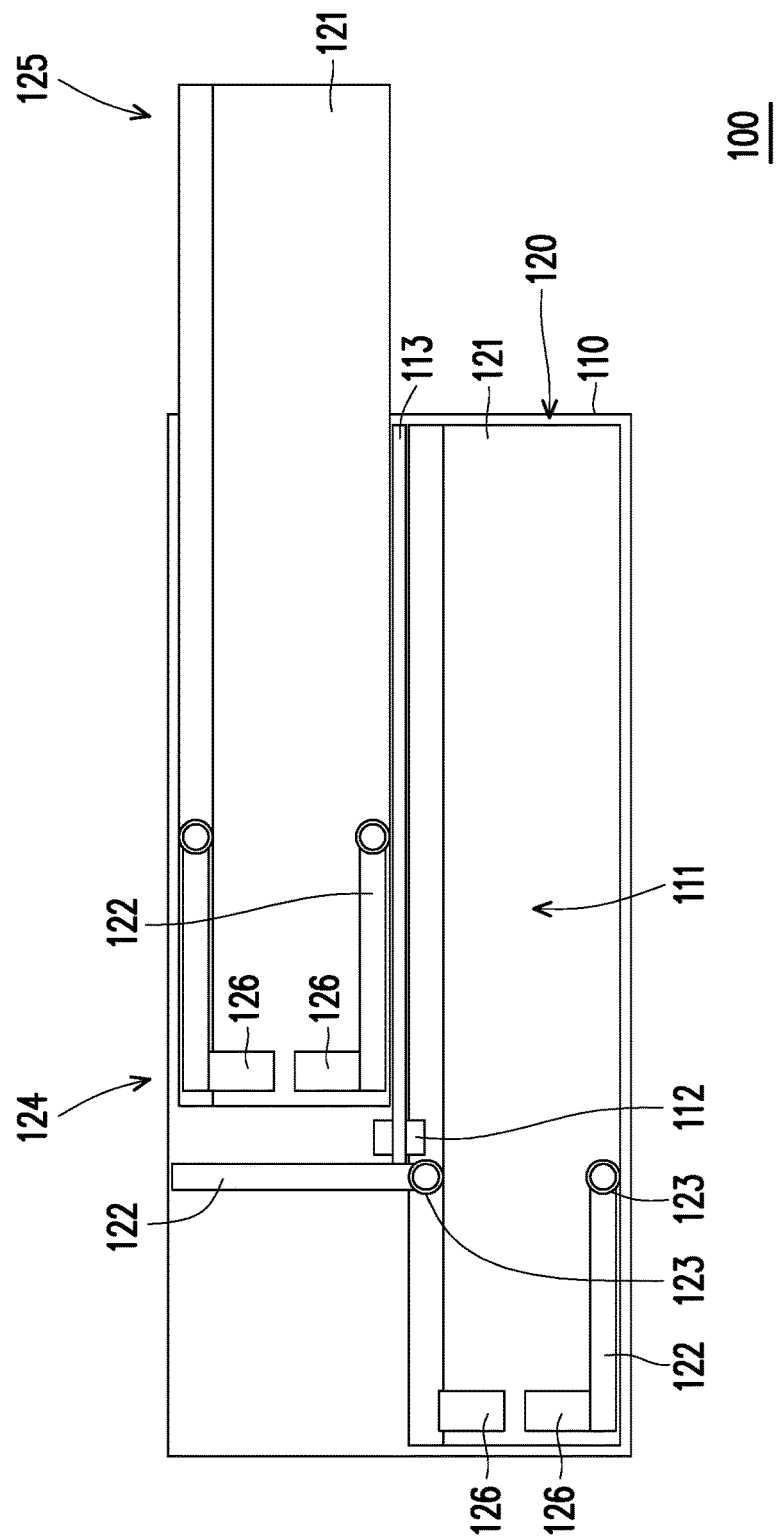
FIG. 2 illustrates that a server unit in FIG. 1 is not completely disposed in a server chassis.

FIG. 1 is a schematic side view illustrating a server according to an embodiment of the disclosure. FIG. 2 illustrates that a server unit in FIG. 1 is not completely disposed in a server chassis. Referring to FIG. 1 and FIG. 2, in the embodiment, a server 100 includes a chassis 110 and a server unit 120 (two are shown in the drawing). Each of the server units 120 is adapted to be disposed in the chassis 110 as shown in FIG. 1, and the chassis 110 has an accommodating space 111 (two are illustrated in the drawing) that can receive the server unit 120. Each of the server units 120 has a main body 121, at least one blocking board 122 and at least one elastic element 123. The main body 121 is adapted to be received in the corresponding accommodating space 111. The blocking board 122 is pivoted to the main body 121. The elastic element 123 is, for example, a torsion spring and connected between the main body 121 and the blocking board 122. The blocking board 122 may be rotated pivotally between a closed state and an opened state relative to the main body 121. The blocking board 122 is adapted with a tendency to rotate pivotally from the closed state to the opened state through the elastic force of the elastic element 123.

The number of the blocking board 122 of each of the server units 120 is two for exemplary purpose, and the blocking board 122 is pivoted to two opposite sides of the main body 121 respectively, which should not be construed as a limitation to the disclosure. For example, the number of the blocking board 122 may be one, and the blocking board 122 is pivoted to one side of the main body 121. Additionally, the main body 121 has a front end 125 and a rear end 124 opposite to each other and adapted to enter the accommodating space 111 through the rear end 124. In the drawings, the blocking board 122 is disposed at the rear end 124 of the main body 121, which should not be construed as a limitation to the disclosure. For example, the blocking board 122 may be disposed at the front end 125 of the main body 121.

In the state shown in FIG. 1, the two server units 120 are disposed in the accommodating space 111. The lower blocking boards 122 of the upper server unit 120 and the upper blocking board 122 of the lower server unit 120 have the tendency to be rotated pivotally to the opened state due to the elastic force of the elastic element 123 of the respective blocking boards 122, and the blocking boards 122 push against each other to stop the pivoting rotation performed by each other. That is to say, when the two server units 120 are respectively received in the two accommodating spaces 111, each of the server units 120 is adapted to stop the blocking board 122 of the other server unit 120 from being rotated pivotally to the opened state.

The server unit 120 further includes at least one locking structure 126, and the locking structure 126 is disposed in the main body 121. When the blocking board 122 is in the closed state, the blocking board 122 is adapted to be locked on the locking structure 126. The number of the locking structure 126 of each of the server units 120 in the drawings is shown for exemplary purpose but not to limit the scope of the disclosure. In the state shown in FIG. 2, the upper server unit 120 is in the state of a process through which the upper server unit 120 is moved in or out of the accommodating space 111, and the lower server unit 120 is in the state of being completely installed in the accommodating space 111. In terms of the upper server unit 120 in FIG. 2, the upper and lower blocking boards 122 are in the closed state and adjacent to the outer surface of the main body 121, and locked with the locking structure 126. In terms of the lower server unit 120 in FIG. 2, the upper blocking board 122 and the locking structure 126 of the main body 121 are separated from each other, and the upper blocking board 122 is in the opened state. The upper blocking board 122 is opened from the outer surface of the main body 121 and blocks the other accommodating space 111. Meanwhile, the lower blocking board 122 is in the closed state and adjacent to the outer surface of the main body 121 and locked with the locking structure 126.

More specifically, the chassis 110 further has at least one spacer 113 and at least one bump 112. The bump 112 is disposed on the upper and lower surfaces of the spacer 113, and the spacer 113 divides the space in the chassis 110 into two accommodating spaces 111. In the process that the upper server unit 120 is disposed from the state shown in FIG. 2 to the state shown in FIG. 1, the main body 121 of the sever unit 120 is moved along the spacer 113. When the blocking board 122 passes through the bump 112, the bump 112 is adapted to prop the blocking board 122 toward the locking structure 126 such that the locking structure 126 releases the blocking board 122. When the upper server unit 120 is disposed completely as shown in FIG. 1, the lower blocking board 122 is not locked on the locking structure 126. Similarly, when the lower server unit 120 is disposed completely as shown in FIG. 1, the upper blocking board 122 is not locked on the locking structure 126. In this manner, when the upper server unit 120 is moved away from the chassis 110, the upper blocking board 122 of the lower server unit 120 may be automatically opened to be in the state shown in FIG. 2 through the elastic force of the elastic element 123. In other words, when the upper blocking board 122 of the lower server unit 120 is in the opened state, and the main body 121 of the lower server unit 120 and the upper blocking board 122 of the lower server unit 120 are projected on a plane behind the chassis 110 on the left side of FIG. 2, the projections of the main body 121 and the upper blocking board 122 are not overlapped to each other. Alternatively, when the lower server unit 120 is moved away from the chassis 110, the lower blocking board 122 of the upper server unit 120 may be automatically opened through the elastic force of the elastic element 123. That is to say, when the lower blocking board 122 of the upper server unit 120 is in the opened state, and the main body 121 of the upper server unit 120 and the lower blocking board 122 of the upper server unit 120 are projected on a plane behind the chassis 110 on the left side of FIG. 2, the projections of the main body 121 and the lower blocking board 122 are not overlapped to each other. Furthermore, the plane behind the chassis 110 and the outer surface of the main body 121 are not parallel with each other. In the embodiment, the plane behind the chassis 110 and the outer surface of the main body 121 are perpendicular to each other.

In the process that the upper server unit 120 is moved from the state shown in FIG. 1 to the state shown in FIG. 2, when the blocking board 122 passes through the bump 112, the bump 112 is adapted to prop the blocking board 122 toward the locking structure 126 such that the blocking board 122 is locked on the locking structure 126. In this manner, when the user completely takes out the upper sever unit 120, the blocking board 122 is fixed by the locking structure 126 to be in the closed state so as to enter the chassis 110 again. Similarly, in the process that the lower server unit 120 is moved out of the accommodating space 111, when the blocking board 122 passes through the bump 112, the bump 112 is adapted to prop the blocking board 122 toward the locking structure 126 such that the blocking board 122 is locked on the locking structure 126. In this manner, when the user completely takes out the lower server unit 120, the blocking board 122 is fixed by the locking structure 126 to be in the closed state so as to enter the chassis 110 again.

In the embodiment, the chassis 110 has a spacer 113 to divide the space in the chassis 110 into two accommodating spaces 111 and two bumps 112 are respectively disposed on the upper and lower surfaces of the spacer 113, which should not be construed as a limitation to the disclosure. For example, the chassis 110 may have two spacers 113 to divide the space in the chassis 110 into three accommodating spaces 111, and the upper and lower surfaces of each of the spacers 113 are respectively provided with two bumps 112.

With the structure of the blocking board 122 that can be rotated pivotally between the closed state and the opened state of the server unit 120 described in the above embodiments, when a server unit 120 is taken from an accommodating space 111 of the chassis 110, the blocking board 122 of another adjacent server unit 120 may be opened to block the accommodating space 111 from which the sever unit 120 is taken, thereby preventing the heat from flowing out of the accommodating space 111 and returning back to the chassis 110. Meanwhile, by disposing the blocking board 122 on the server unit 120 instead of the chassis 110, the configuration space in the chassis 110 can be saved. The number of the elements in the above embodiments of the disclosure is shown for exemplary purpose and does not serve to limit the scope of the disclosure. Also, the number of elements may be changed depending on the need.

In the embodiment, the locking structure 126 may be a locking element in any appropriate forms, which should not be construed as a limitation to the disclosure. Another embodiment below exemplifies the specific realization of the locking structure.

Figure 3:
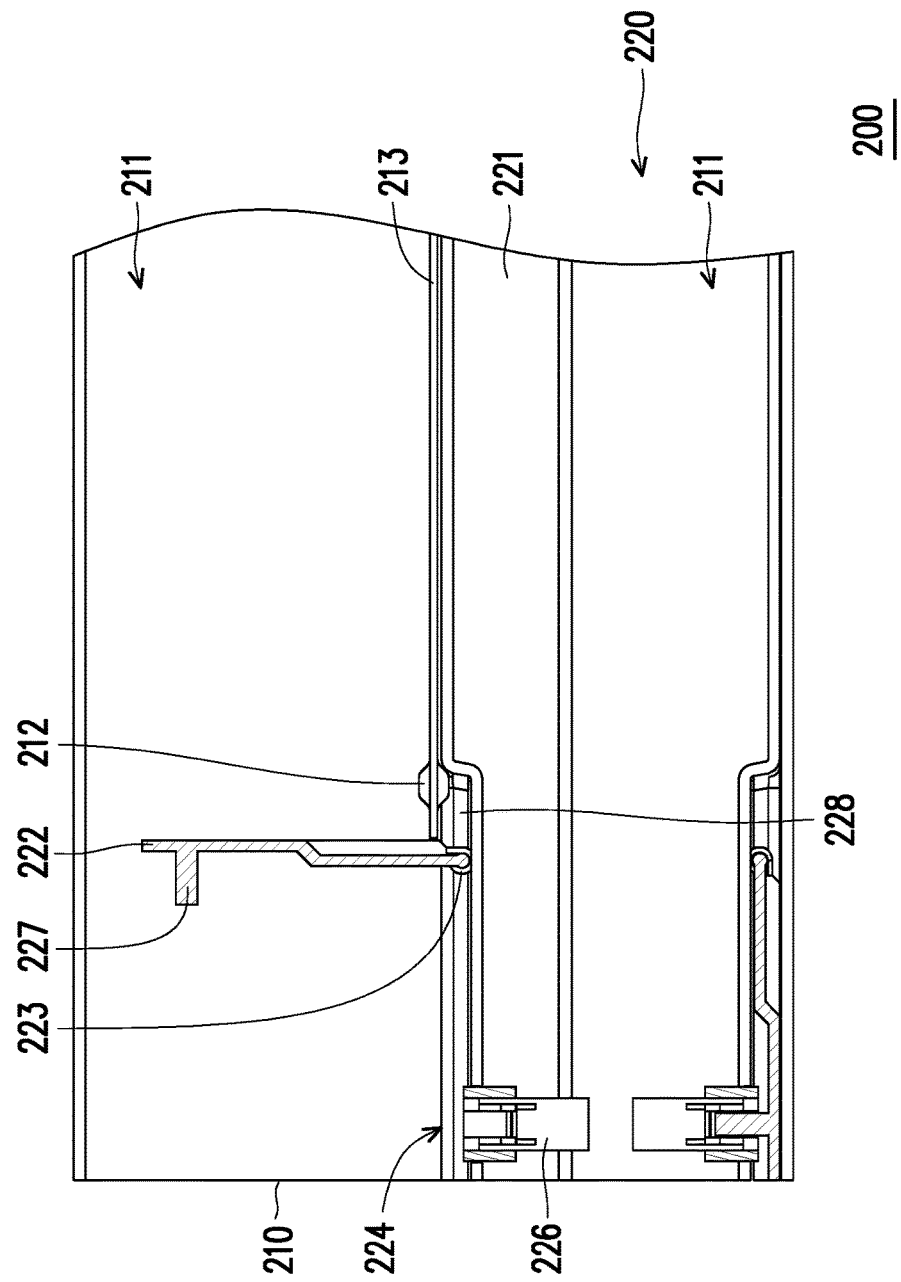
FIG. 3 is a schematic side view illustrating a part of a server according to another embodiment of the disclosure.
Figure 4:
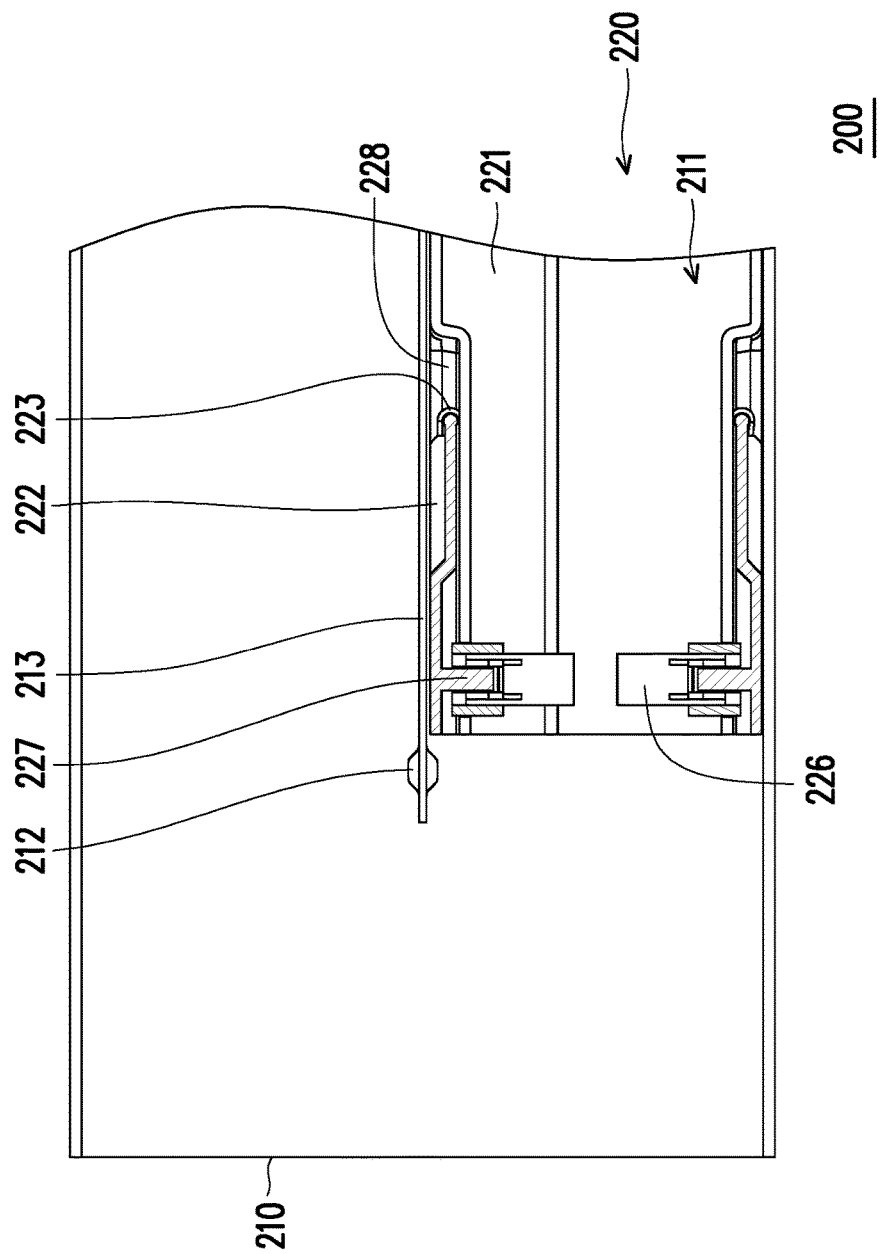
FIG. 4 illustrates that a server unit in FIG. 3 is not completely disposed in a server chassis.

FIG. 3 is a schematic side view illustrating a part of a server according to another embodiment of the disclosure. FIG. 4 illustrates that a server unit in FIG. 3 is not completely disposed in a server chassis. In a server 200 shown in FIG. 3 and FIG. 4, a locking structure 226 of a server unit 220 is a push-push latch, and the configuration and function of a chassis 210, an accommodating space 211, a bump 212, a spacer 213, the server unit 220, a main body 221, a blocking board 222, an elastic element 223, a rear end 224, and a locking structure 226 shown in FIG. 3 and FIG. 4 are similar to the configuration and function of the chassis 110, the accommodating space 111, the bump 112, the spacer 113, the sever unit 120, the main body 121, the blocking board 122, the elastic element 123, the rear end 124, and the locking structure 126 shown in FIG. 1 and FIG. 2; no repetition is incorporated herein.

In the embodiment, the blocking board 222 of the server 200 has a boss 227, and the blocking board 222 is adapted to be locked on the push-push latch (locking structure 226) through the boss 227. In the process that the server unit 220 is disposed in the chassis 210, when the blocking board 222 passes through the bump 212 such that the bump 212 props the blocking board 222, the boss 227 pushes the locking structure 226 for one time such that the push-push latch release the boss 227. On the contrary, in the process that the server unit 220 is taken out of the chassis 210, when the blocking board 222 passes through the bump 212 such that the bump 212 props the blocking board 222, the boss 227 pushes the locking structure 226 once again such that the push-push latch locks the boss 227.

Additionally, the main body 221 in the embodiment further has a space-allowing recess 228. When the server unit 220 is received in the accommodating space 211, the bump 212 may be disposed in the space-allowing recess 228 so as not to interfere with the main body 221 of the server unit 220.

Figure 5:
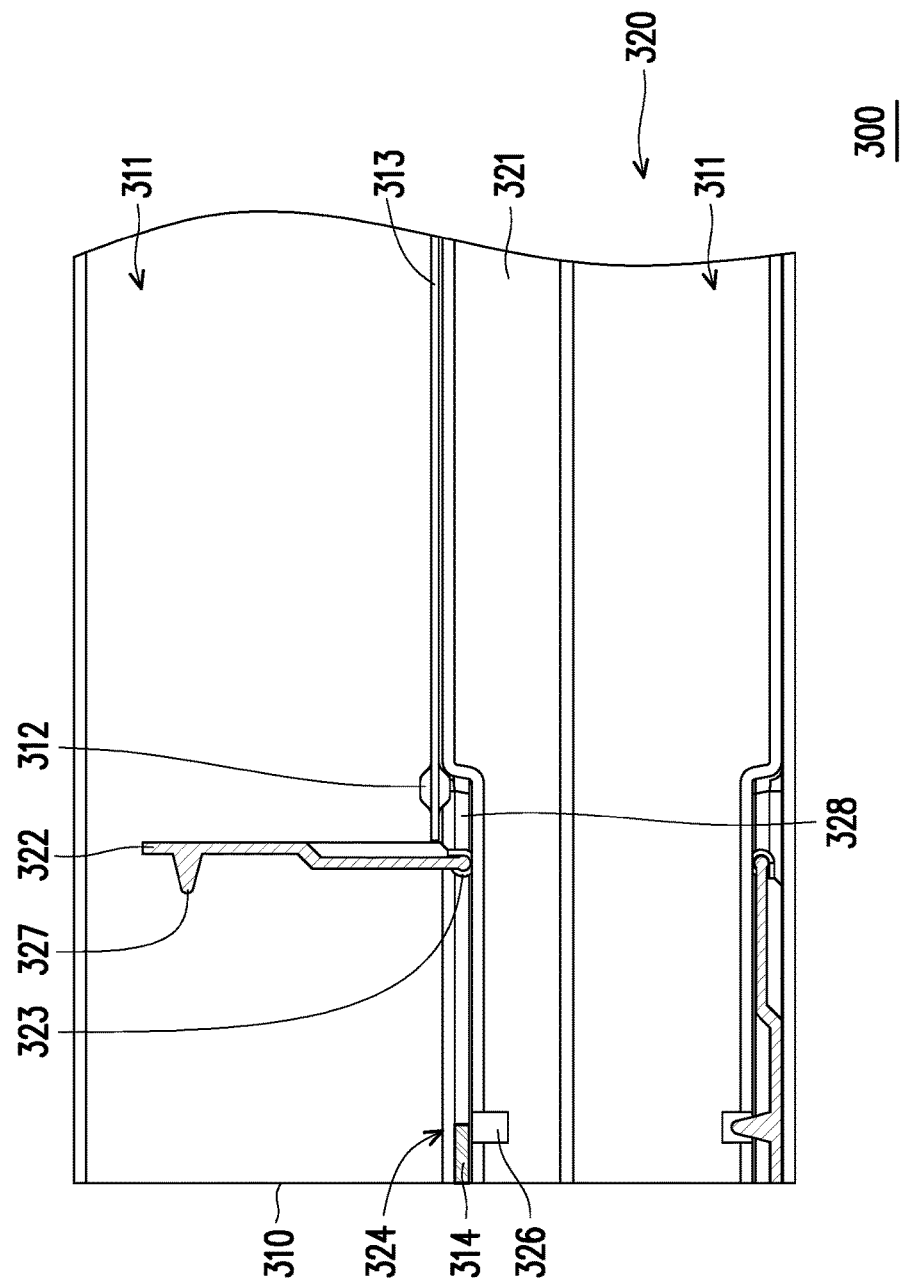
FIG. 5 is a schematic side view illustrating a part of a server according to another embodiment of the disclosure.
Figure 6B:
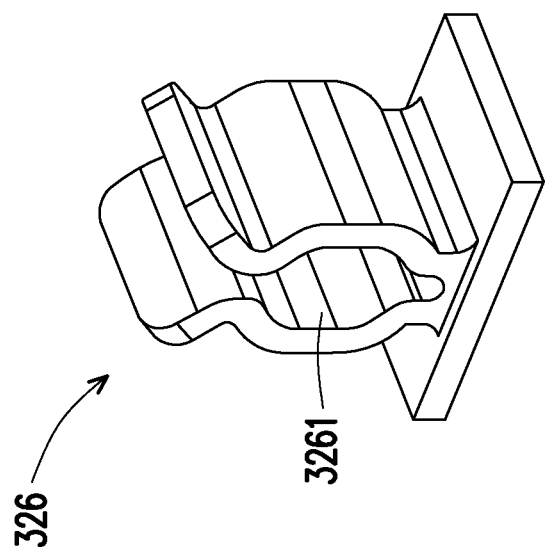
FIG. 6A and FIG. 6B are perspective views illustrating a locking structure and a boss according to another embodiment of the disclosure.
Figure 6A:
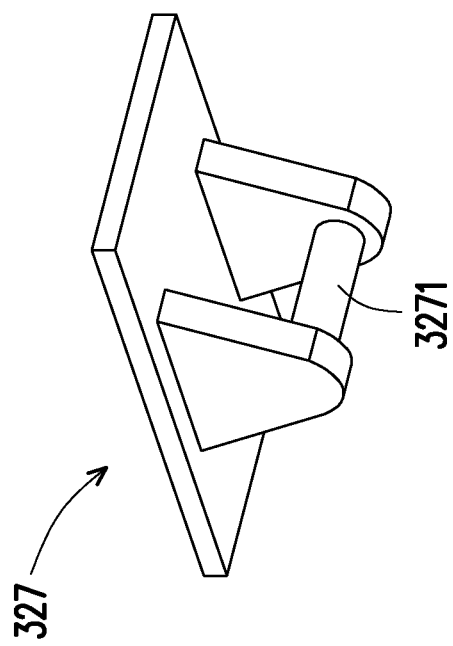

FIG. 5 is a schematic side view illustrating a part of a server according to another embodiment of the disclosure. In a server 300 shown in FIG. 5, the configuration and function of a chassis 310, an accommodating space 311, a bump 312, a spacer 313, a server unit 320, a main body 321, a blocking board 322, an elastic element 323, a rear end 324, and a space-allowing recess 328 are similar to the configuration and function of the chassis 210, the accommodating space 211, the bump 212, the spacer 213, the server unit 220, the main body 221, the blocking board 222, the elastic element 223, the rear end 224, and the space-allowing recess 228 shown in FIG. 3; no repetition is incorporated herein. The difference between the server 300 and the server 200 is that the server 300 in the embodiment has a locking structure 326 and a boss 327 that are structurally different from the locking structure 226 and boss 227 of the server 200. FIG. 6A and FIG. 6B are perspective views illustrating detailed structure of the locking structure 326 and the boss 327 shown in FIG. 5. Referring to FIG. 6A and FIG. 6B, the boss 327 has a pillar 3271, the locking structure 326 has a groove 3261. When the boss 327 is engaged with the locking structure 326, the pillar 3271 is adapted to enter the groove 3261 of the locking structure 326 and locked with each other. The space of the groove 3261 in the vertical direction is slightly larger than the size of the pillar 3271 of the boss 327. In this manner, when the bump 312 props the blocking board 322, a travelling space can be provided to allow the boss 327 to be pushed toward the locking structure 326. As shown in FIG. 5, the chassis 310 further has a pin 314. The pin 314 is disposed on the rear side of the chassis 310. When the server unit 320 is disposed in the accommodating space 311, the pin 314 is inserted in the gap between the boss 327 and the main body 321, and the boss 327 is pried from the locking structure 326 such that the locking structure 326 releases the blocking board 322. In other embodiments, the locking structure may be a locking element in other forms, which should not be construed as a limitation to the disclosure.

Figure 7:
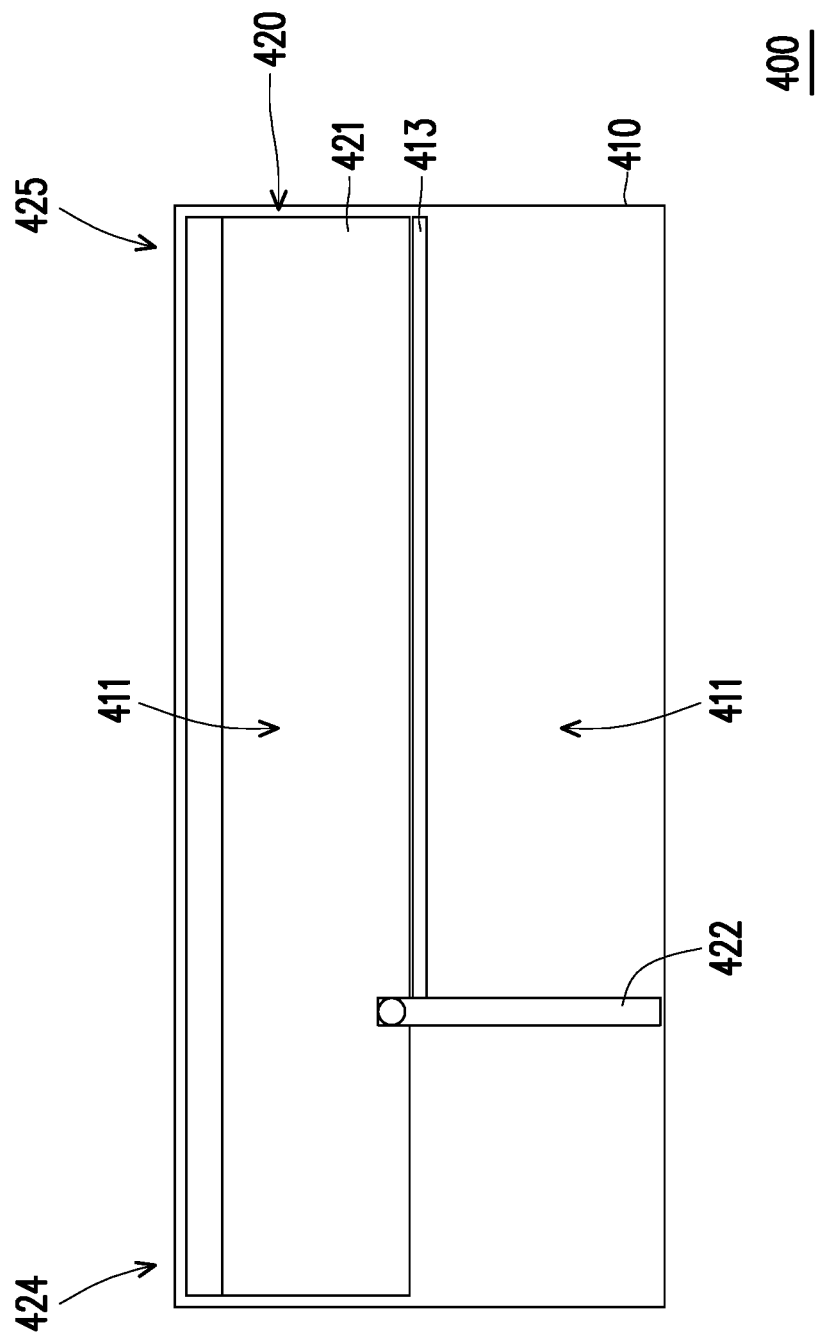
FIG. 7 is a schematic side view illustrating a server according to another embodiment of the disclosure.

FIG. 7 is a schematic side view illustrating a server according to another embodiment of the disclosure. In a server 400 shown in FIG. 7, the configuration and function of a chassis 410, an accommodating space 411, a spacer 413, a server unit 420, a main body 421, a rear end 424, and a front end 425 are similar to the configuration and function of the chassis 110, the accommodating space 111, the spacer 113, the server unit 120, the main body 121, the rear end 124, and the front end 125 shown in FIG. 1; no repetition is incorporated herein. The difference between the server 400 in the embodiment and the server 100 is that the server unit 420 in the embodiment only has one blocking board 422 disposed on the lower surface of the server unit 410 without the locking structure and elastic element. The chassis 410 installed with the server unit 420 is not provided with the bump on the spacer 413. When the server unit 420 is disposed in the upper accommodating space 411 as shown in FIG. 7, the lower blocking board 422 of the server unit 420 is naturally opened downward due to gravity, and thus blocking the lower accommodating space 411.

In summary, in the server unit of the disclosure, since there is at least one blocking structure in the configuration, when the sever unit is taken out of the chassis, the blocking board of the adjacent server unit may be rotated pivotally to be in the opened state, thereby preventing the heat from flowing out of the accommodating space and returning back to the chassis, thus preventing the server unit from being over-heated. In this manner, there is no need to leave additional space for disposing blocking board in the chassis that receives server unit, and the need for heat-dissipation of the server can be satisfied, thus saving the configuration space in the server chassis.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A server unit, adapted to be disposed in a chassis, the chassis having two accommodating spaces, the server unit comprising:
   a main body, received in one of the accommodating spaces; and
   a blocking board, pivoted to the main body and rotated pivotally between a closed state and an opened state, wherein when the blocking board is in the closed state, the blocking board is adjacent to an outer surface of the main body, when the blocking board is in the opened state, the blocking board is opened from the outer surface and blocks the other accommodating space.

2. The server unit according to claim 1, further comprising a locking structure disposed on the main body, wherein when the blocking board is in the closed state, the blocking board is adapted to be locked on the locking structure.

3. The server unit according to claim 2, wherein the blocking board has a boss, the blocking board is locked on the locking structure through the boss.

4. The server unit according to claim 2, wherein the chassis has a bump adapted to prop the blocking board toward the locking structure such that the blocking board is locked on or released from the locking structure.

5. The server unit according to claim 4, wherein the chassis has a pin adapted to be inserted between the blocking board and the locking structure such that the locking structure releases the blocking board.

6. The server unit according to claim 4, wherein the chassis has a spacer disposed therein, the spacer divides the accommodating spaces, the bump is disposed on the spacer, the main body is adapted to be moved along the spacer and pass through the bump.

7. The server unit according to claim 4, wherein the main body has a space-allowing recess, when the server unit is received in the accommodating space, the bump is disposed in the space-allowing recess.

8. The server unit according to claim 1, further comprising an elastic element connected between the main body and the blocking board, wherein the blocking board is adapted to rotate pivotally from the closed state to the opened state through elastic force of the elastic element.

9. The server unit according to claim 1, comprising another blocking board, the two blocking boards respectively pivoted to two opposite sides of the main body and respectively rotated pivotally between the closed state and the opened state.

10. The server unit according to claim 1, wherein the main body has a front end and a rear end opposite to each other, the main body enters the accommodating space through the rear end, and the blocking board is disposed at the rear end.

11. A server unit, adapted to be disposed in a chassis, the server unit comprising:
    a main body, received in the chassis, and
    a blocking board, pivoted to the main body and rotated pivotally between a closed state and an opened state, wherein when the blocking board is in the closed state, the blocking board is adhered to an outer surface of the main body, when the blocking board is in the opened state, projections of the main body and the blocking board on a plane behind the chassis are not overlapped to each other, the outer surface and the plane are perpendicular to each other.

12. A server, comprising:
    a chassis, having two accommodating spaces; and
    a server unit, adapted to be disposed in the chassis, the server unit comprising:
    a main body, received in one of the accommodating spaces; and
    a blocking board, pivoted to the main body and rotated pivotally between a closed state and an opened state, wherein when the blocking board is in the closed state, the blocking board is adjacent to an outer surface of the main body, when the blocking board is in the opened state, the blocking board is opened from the outer surface and blocks the other accommodating space.

13. The server according to claim 12, wherein the server unit comprises a locking structure disposed on the main body and the blocking board has a boss, when the blocking board is in the closed state, the blocking board is adapted to be locked on the locking structure through the boss.

14. The server according to claim 13, wherein the chassis has a bump adapted to prop the blocking board toward the locking structure such that the blocking board is locked on or released from the locking structure.

15. The server according to claim 14, wherein the chassis has a spacer disposed therein, the spacer divides the accommodating spaces, the chassis has two bumps respectively disposed on upper and lower surfaces of the spacer, the main body is adapted to be moved along the spacer and pass through the bump.

16. The server according to claim 12, wherein the server unit further comprises an elastic element connected between the main body and the blocking board, the blocking board is adapted to rotate pivotally from the closed state to the opened state through elastic force of the elastic element.

17. The server according to claim 12, wherein the server unit comprises another blocking board, the two blocking boards are respectively pivoted to two opposite sides of the main body and respectively rotated pivotally between the closed state and the opened state.

18. The server according to claim 12, wherein the main body has a front end and a rear end opposite to each other, the main body enters the accommodating space through the rear end, the blocking board is disposed at the rear end.

19. The server according to claim 12, comprising another server unit, wherein when the two server units are respectively received in the accommodating spaces, one of the server units stops the blocking board of the other server units from rotating pivotally to the opened state.

20. The server according to claim 12, wherein when the blocking board is in the opened state, projections of the main body and the blocking board on a plane behind the chassis are not overlapped to each other, and the outer surface and the plane are perpendicular to each other.

* * * * *